United States Patent
Terasaka et al.

(10) Patent No.: US 6,335,492 B1
(45) Date of Patent: *Jan. 1, 2002

(54) TAPE CARRIER PACKAGE WITH IMPROVED CONNECTING TERMINALS AND A METHOD OF ELECTRICALLY INTERCONNECTING THE TAPE CARRIER PACKAGE TO EXTERNAL CIRCUITRY

(75) Inventors: Shinji Terasaka; Satoshi Hatazawa, both of Tokyo (JP)

(73) Assignee: NEC Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/845,612

(22) Filed: Apr. 25, 1997

(30) Foreign Application Priority Data

Apr. 25, 1996 (JP) ............................................. 8-105604

(51) Int. Cl.[7] ............................................. H01R 23/72
(52) U.S. Cl. ........................ 174/261; 257/668; 257/673; 257/735; 257/739; 361/772; 361/773
(58) Field of Search ........................ 174/261; 257/666, 257/668, 673, 734, 735, 739; 361/723, 772, 773, 813

(56) References Cited

U.S. PATENT DOCUMENTS

| | | | |
|---|---|---|---|
| 5,173,369 A | * 12/1992 | Kataoka | ................. 257/666 X |
| 5,390,079 A | 2/1995 | Aomori et al. | .............. 361/749 |
| 5,430,614 A | * 7/1995 | Diframcesco | ................ 361/785 |
| 5,517,752 A | * 5/1996 | Sakata et al. | ........... 174/260 X |
| 5,578,526 A | * 11/1996 | Akram et al. | ................ 437/209 |

FOREIGN PATENT DOCUMENTS

| JP | 3-291950 | * 12/1991 |
|---|---|---|
| JP | 595024 | 4/1993 |

* cited by examiner

*Primary Examiner*—Albert W. Paladini
(74) *Attorney, Agent, or Firm*—Hayes, Soloway, Hennessey, Grossman & Hage, P.C.

(57) ABSTRACT

A tape carrier package (TCP) with improved connecting terminals is disclosed. The TCP includes a base film of non-conductive material which carries a plurality of conductive leads on one surface thereof. A plurality of connecting terminals are deposited on the surface such as to be electrically interconnected to the ends of the conductive leads. Each of the connecting terminals has an acute-angled top portion and includes an inner member of a first material and an outer member of a second material plated on the inner member. The acute-angled top portion of the second material is easily deformable when the connecting terminal is pressed against a corresponding terminal provided on a board to be interconnected to the TCP. Thus, an adequate interconnection area is obtained between the TCP and the circuit provided on the board.

9 Claims, 4 Drawing Sheets

TAPE CARRIER PACKAGE WITH IMPROVED CONNECTING TERMINALS AND A METHOD OF ELECTRICALLY INTERCONNECTING THE TAPE CARRIER PACKAGE TO EXTERNAL CIRCUITRY

BACKGROUND OF THE INVENTION

1. Field of the Invention

The present invention relates generally to improvements in packaging of miniaturized electronic components or the like, and more specifically to a tape carrier package having improved connecting (viz., bonding) terminals via which fine-pitch interconnections with external circuitry can effectively be achieved. Still more specifically, the present invention relates to a method of electrically interconnecting input and/or output terminals of a tape carrier package to the corresponding ones of an external component(s) or the like.

2. Description of the Related Art

As is known in the art, a tape carrier package (TCP) comprises a flexible base film-of polyimide (for example), which carries thereon a plurality of conductive leads typically made of copper and further carries one or more IC (integrated circuit) chips. The opposite ends of each of the conductive leads are coupled to connection terminals via which the TCP can be interconnected to external circuitry. Such a TCP is disclosed in U.S. Pat. No. 5,390,079 to Aomori, et al. by way of example.

Before turning to the present invention it is deemed preferable to briefly describe, with reference to FIGS. 1 and 2, a conventional technique which may be relevant to the present invention. This conventional technique is disclosed in Japanese Laid-open Patent Application No. 5-95024.

FIG. 1 is a schematic top plan view of an electronic component assembly (depicted by numeral 10) which generally comprises a TCP 12, a liquid crystal panel 14 surrounded by a liquid crystal display (LCD) terminal board 16, and a printed circuit board 18. The TCP 12 includes a non-conductive flexible base film 20 on which, in this particular case, an LCD driver IC (integrated circuit) chip 22 is mounted. The IC chip's bonding pads are connected to the conductive leads.

As mentioned above, the TCP 12 is provided with a plurality of conductive leads on one surface thereof (the lower surface in FIG. 1 and thus the conductive leads are not shown). As shown in FIG. 1, the TCP 12 has the input side (the left side in the drawing) electrically coupled to the printed circuit board 18 using an anisotropic conductive film (ACF) 24. In a similar manner, the TCP 12 has the output side (the right side in the drawing) electrically interconnected to the LCD terminal board 16 by way of another AFC 26.

As is known in the art, an ACF is an anisotropic conductive adhesive material, and consists of conductive spheroidal particles dispersed in a thermosetting (for example) adhesive matrix. The conductive particles can typically be pure metals such as gold, silver, or nickel. Mean conductive particle sizes are about 5 $\mu$m (for example).

FIG. 2 shows, in part, a cross section taken along a line I—I in FIG. 1, which schematically illustrates a manner where the TCP 12 is electrically connected to the printed circuit board 18 using the ACF 24. As shown, the base film 20 of the TCP 12 has its lower surface on which a plurality of connecting terminals 27 (only three illustrated) are disposed. Each of the terminals 27 consists of an inner member 28, made of copper, which has a trapezoid-shaped cross-section and is coated (plated) with tin (Sn). In FIG. 2, the tin-coated layer is depicted by numeral 30, and the above mentioned conductive particles are indicated by numeral 32. Further, a plurality of connecting terminals on the printed circuit board 18 are depicted by numeral 34. Each of the terminals 27 is typically about 18 $\mu$m high and typically plated by tin (Sn) up to a thickness of about 0.3 $\mu$m. Still further, each connecting terminal 27 has a width of about 40 $\mu$m and is separated from the adjacent one by about 30 $\mu$m. Each of the connecting terminals 27 has a length of about 2.5 mm extending in a direction perpendicular to the paper.

When the connecting terminals 27 of the base film 20 are to be interconnected to the corresponding ones 34 of the circuit board 18, the ACF 24 is placed on the printed circuit board 18 in a manner to cover the connecting terminals 34. Subsequently, the TCP 12 is deposited on the ACF 24 after being aligned with the printed circuit board 18. Thereafter, the ACF 24 is heated and pressed with an appropriate load and then cured. Thus, the bonding terminals 27 are electrically coupled to the counterparts 34 via a monolayer of deformed conductive particles 32.

On the other hand, the interconnection of the TCP 12 to the peripheral LCD panel 16 is implemented, concurrently with the aforesaid interconnection of TCP 12 to the circuit board 18, using the ACF 26 in exactly the same manner as mentioned above.

As mentioned above, the connecting terminals 27 are electrically coupled to the terminals 34 via a monolayer of conductive particles. In such a case, an area which contributes to the actual electrical connection is as low as about 10% compared with the entire facing area of the terminals 27 and 34. If the electrically connecting area should be increased while maintaining the terminal pitch, it is necessary to elongate or extend the length of each of the connecting terminal 27 with the result of undesirable increase in the size of the LCD terminal board 16. This conflicts with the current tendency of increasing the LCD size in a very limited space. Further, in the case where the terminal pitch becomes fine, the conventional technique using the ACF may encounter the problem that a short circuit may be produced between the adjacent connecting terminals due to linkage of the conductive particles.

SUMMARY OF THE INVENTION

It is therefore an object of the present invention to provide a tape carrier package with improved connecting terminals via which the above mentioned difficulties inherent in the conventional packaging can effectively be eliminated.

Another object of the present invention is to provide a method of electrically interconnecting a tape carrier package with improved connecting terminals to an external circuit board.

These objects are fulfilled by a tape carrier package (TCP) with improved connecting terminals. The TCP includes a base film of non-conductive material which carries a plurality of conductive leads on one surface thereof. A plurality of connecting terminals are deposited on the surface such as to be electrically interconnected to the ends of the conductive leads. Each of the connecting terminals has an acute-angled top portion and comprises an inner member of a first material and an outer member of a second material plated on the inner member. The acute-angled top portion of second material is easily deformable when the connecting terminal is pressed against a corresponding terminal provided on a board to be interconnected to the TCP. Thus, an adequate interconnection area is obtained between the TCP and the circuit provided on the board.

One aspect of the present invention resides in a tape carrier package which comprises: a base film of non-conductive material, the base film carrying a plurality of conductive leads on a surface thereof; a plurality of connecting terminals which are deposited on the surface and electrically interconnected to the conductive leads, each of the connecting terminals having an acute-angled top portion and comprising an inner member of a first material secured on the surface and an outer member of a second material plated on the inner member, the second material being more readily deformable than the first material.

Another aspect of the present invention resides in a method of interconnecting a tape carrier package to an external circuit board, the tape carrier package comprising; a base film of non-conductive material, the base film carrying a plurality of conductive leads on a surface thereof; a plurality of connecting terminals being deposited on the surface and electrically interconnected to the conductive leads, each of the connecting terminals having an acute-angled top portion and comprising an inner member of a first material secured on the surface and an outer member of a second material covering the inner member, the second material being more readily deformable than the first material, the method comprising the steps of: coating an adhesive on an area including a plurality of connecting terminals which are deposited on the external circuit board and which are made of material similar to the first material; placing the tape carrier package on the external circuit board in a manner where the connecting terminals of the tape carrier package are aligned with corresponding connecting terminals of the external circuit board; and pressing the tape carrier package towards the external circuit board such that the acute-angled top portion contacts a corresponding connecting terminal of the external circuit board and establishes a pressure-contact therewith by elastically deforming the acute-angle top portion.

BRIEF DESCRIPTION OF THE DRAWINGS

The features and advantages of the present invention will become more clearly appreciated from the following description taken in conjunction with the accompanying drawings in which like member or elements are denoted by like reference numerals and in which.

DETAILED DESCRIPTION OF THE PREFERRED EMBODIMENTS

A first embodiment of the present invention will be described with reference to FIGS. 3, 4(A)–4(D), and 5.

Figure 1:
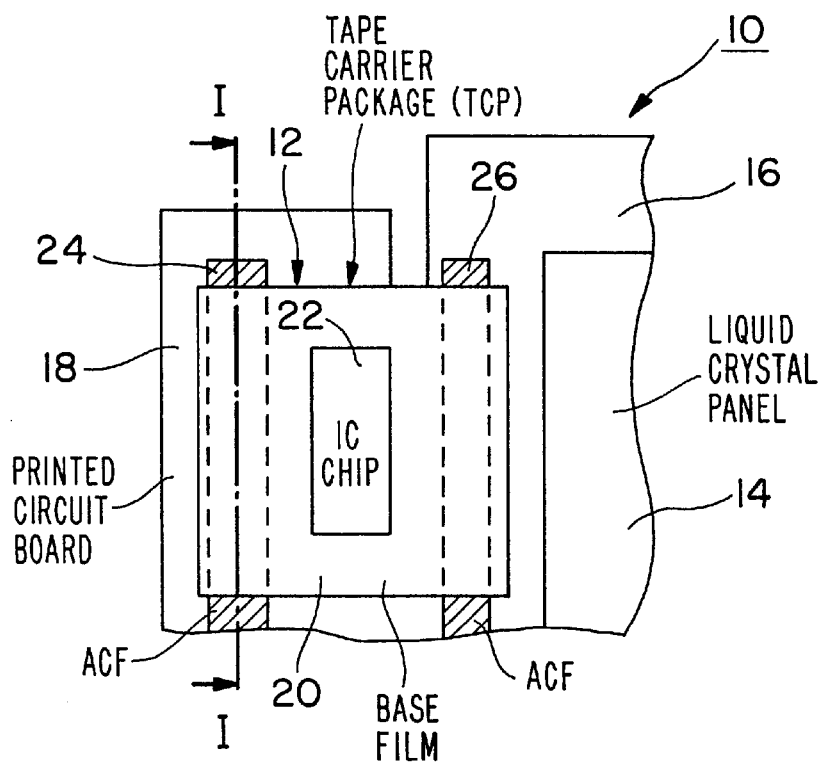
FIG. 1 is a top plan view of a conventional electric component assembly which was referred to in the opening paragraphs of the instant disclosure.
Figure 2:
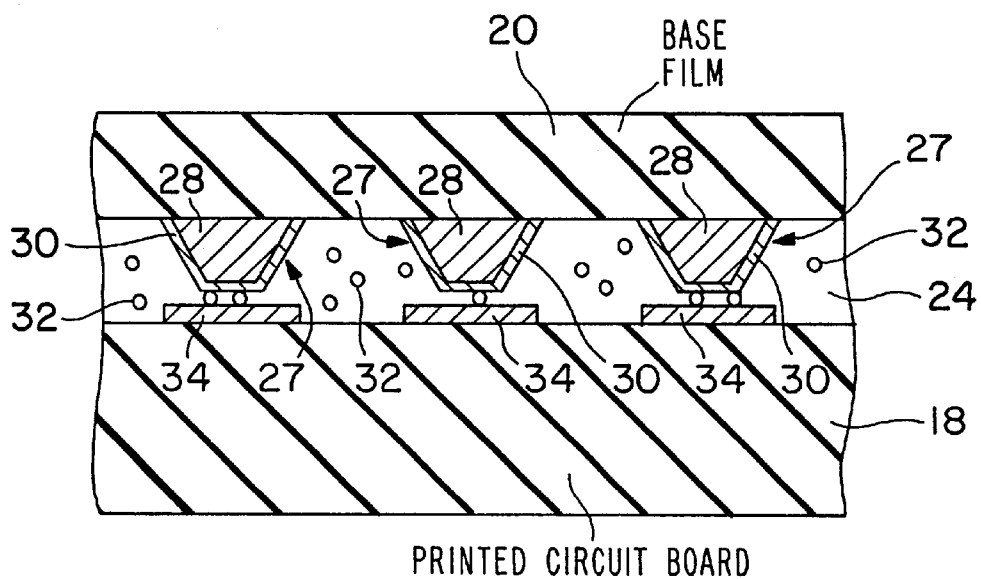
FIG. 2 is part of a cross-sectional view taken along a line I—I of FIG. 1.
Figure 3:
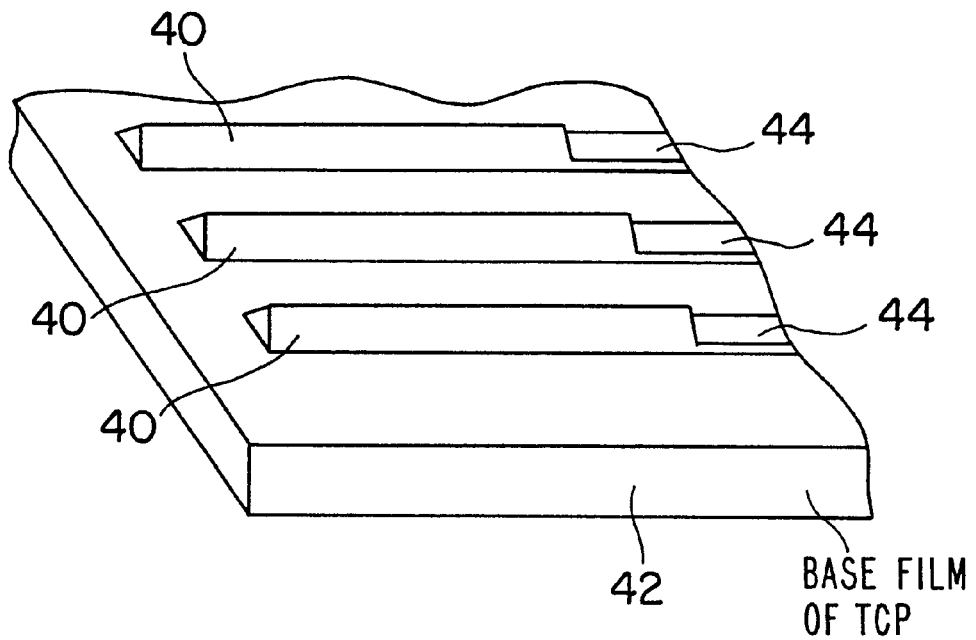
FIG. 3 is a perspective view showing a first embodiment of the present invention;.

FIG. 3 is a schematic perspective view of a plurality of connecting terminals 40 of a TCP according to the present invention. The connecting terminals 40 are deposited on one surface of a flexible base film 42 which is made of an appropriate non-conductive material known in the art and which may be identical to the counterpart 20 shown in FIG. 2. The connecting terminals 40 are respectively coupled to (or integrated with) corresponding conductive leads 44. Although not shown in FIG. 3, one or more than one IC chips are mounted on the base film 42 as shown in FIG. 1 and coupled to the conductive leads 44.

FIGS. 4(A)–4(D) are cross-sectional views schematically showing fabricating processes of configuring the connection terminals 40 on the base film 42. It is to be noted that the forming processes of the conductive leads 44 are not directly concerned with the present invention, and accordingly the descriptions thereof are not given for the sake of simplifying the instant disclosure.

Figure 4A:
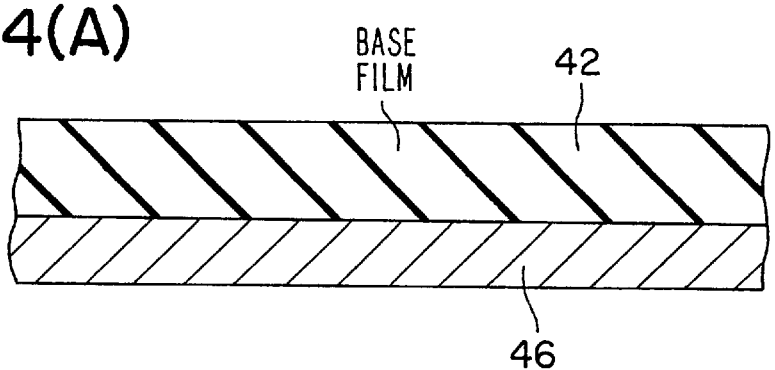
FIGS. 4(A)–4(D) are cross-sectional views schematically describing the fabrication processes of the connecting terminals shown in FIG. 2.
Figure 4B:
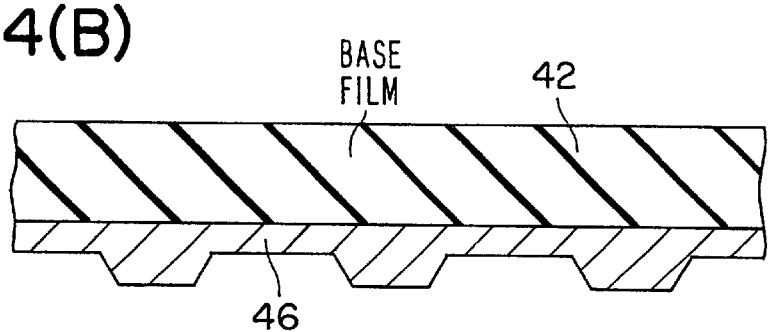
Figure 4C:
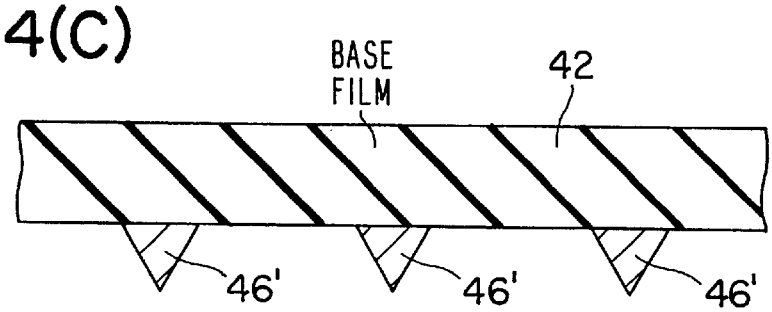
Figure 4D:
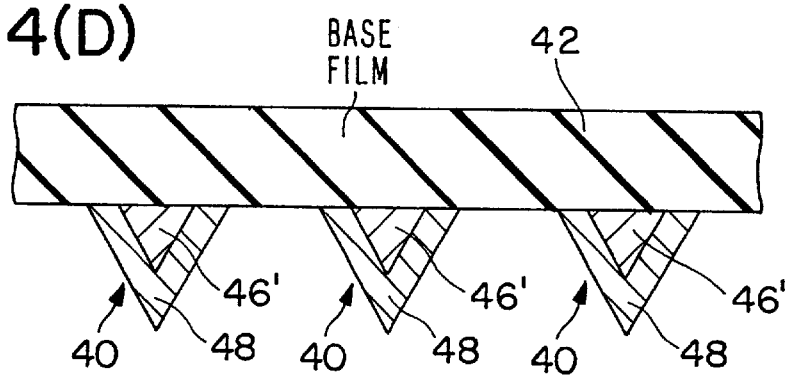

As shown in FIG. 4(A), a copper layer 46 is deposited on one surface of the base film 42 using conventional techniques. The copper layer 46 has a thickness of about 10 to 20 $\mu$m by way of example. Thereafter, the copper layer 46 is selectively etched in a manner known in the art. More specifically, the copper layer 46 is shaped (etched) such as to form a plurality of trapezoids which are still connected at base portions thereof with adjacent ones (FIG. 4(B)). Subsequently, the copper layer 46 is further etched until the cross-section of each copper layer 46 forms a triangle-shaped configuration as shown in FIG. 4(C). Thereafter, the isolated copper portions (depicted by numeral 46') are coated by tin (Sn) as shown in FIG. 4(D). The tin-coated layer is depicted by numeral 48 in FIG. 4(D). Thus, the connecting terminals 40 are formed on the base film 42. By way of example, each of the connecting terminals 40 has a width of about 40 $\mu$m at the base portion, and has a height ranging from 10 to 20 $\mu$m. Further, the thickness of the tin-coated layer 48 is preferably in a range from 5 to 10 $\mu$m.

Young's moduli of Cu and Sn are respectively $12.98 \times 10^{10}$ Pa ($=N/m^{10}$) and $4.99 \times 10^{10}$ Pa. Thus, when the connecting terminal 40 is pressed with a suitable load against a terminal made of copper, the top portion of the tin-coated layer 48 is deformed without difficulty. Further, Young's modulus of Au (gold) is $7.80 \times 10^{10}$ Pa and thus, Au may be utilized as an alternative to Sn. However, the present invention is not limited to the above mentioned metals. It is to be noted that the present invention makes use of a relatively large difference between Young's moduli of two metals.

Figure 5:
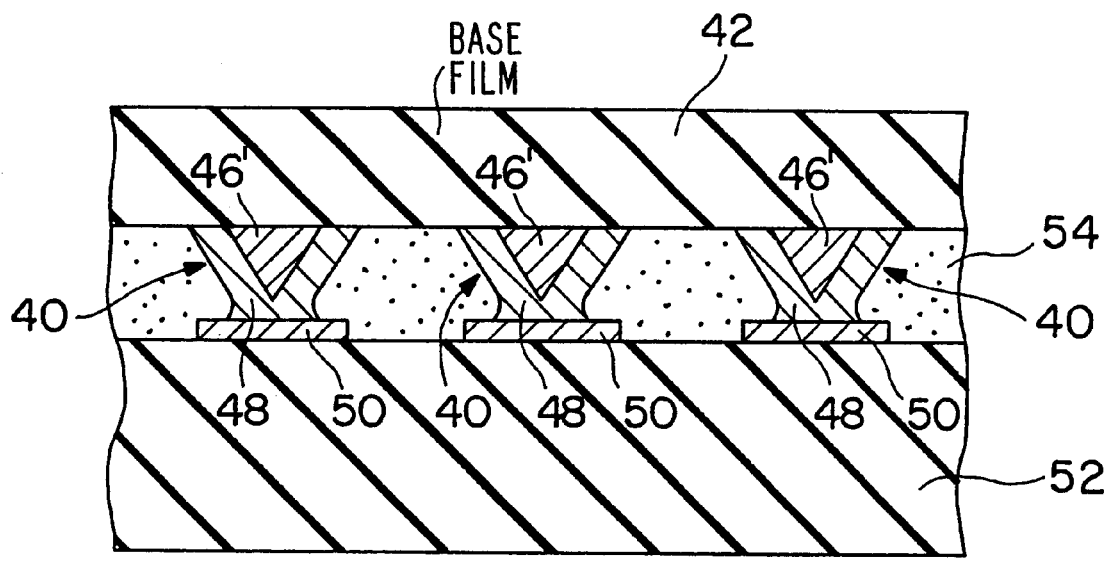
FIG. 5 is a cross-section showing the connecting terminals establishing electrical interconnection with terminals on a given circuit board.

FIG. 5 is a cross-sectional view schematically showing a manner wherein the connecting terminals 40 are in pressure-contact with corresponding counterparts 50 deposited on a given external board 52. The above mentioned pressure-contacting is implemented as follows. An adhesive 54 such as epoxy resin (for example) is coated on the area including the connecting terminals 50 on the board 52. Each of the connecting terminals 50 is made of copper which, as mentioned above, has a Young's modulus higher than tin. Following this, the base film 42 is placed on the board 52 while aligning the connecting terminals 40 with the terminals 50. Thereafter, the base film 42 is pressed down towards the board 52 to an extent that the top portions of the terminals 40 contact the corresponding connecting terminals 50 and are deformed as shown in FIG. 5. By way of example, a pressure load of 30 Kg/m² may be sufficient to deform the top portion of the terminals 40.

It is understood that each of the connecting terminals 40 has a sharp tip portion whereby the pressure load necessary to deform same is relatively small.

Figure 6:
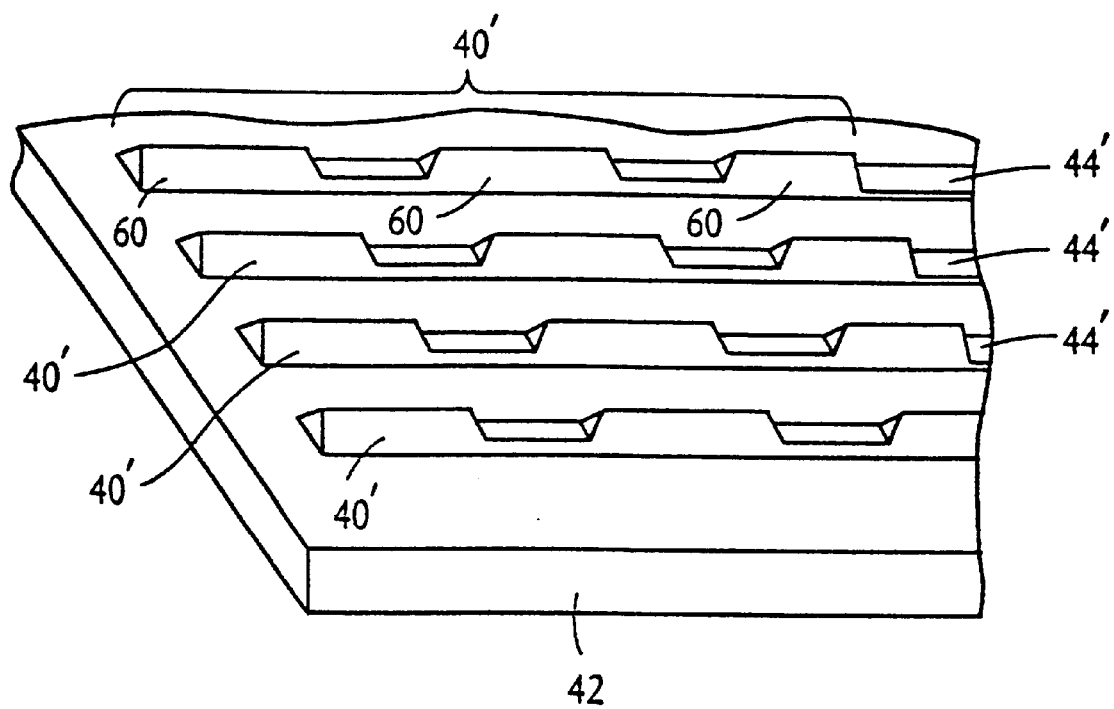
FIG. 6 is a perspective view showing a second embodiment of the present invention.

FIG. 6 is a perspective view showing a second embodiment of the present invention. In this embodiment, each of connecting electrodes 40' includes a plurality of separate prism-like portions 60 arranged in tandem with the two adjacent portions 60 electrically coupled with each other. Further, as in the first embodiment of FIG. 4, the connecting terminals 40' are respectively coupled to (or integrated with) corresponding conductive leads 44'. The manner where each of the connecting terminals 40' establishes a pressure-contact with the counterpart of a given circuit board, is substantially identical to the manner shown in FIG. 5 and thus, further descriptions thereof will be omitted for brevity.

Fabricating the connecting terminals 40' of the second embodiment may be slightly more complex (or time consuming) compared to the terminals 40 of the first embodiment. However, the second embodiment may offer advantages over the first embodiment because when the terminals 40' become pressure-contacted with other terminals (corresponding to 50 in FIG. 5), the adhesive (corresponding to the adhesive 54 of FIG. 5) is not separated by the terminal contacts in the region between the adjacent prism-like portions 60. This, means that the base film 42 is more reliably secured to a circuit board (corresponding to the board 52 of FIG. 5).

Figure 7:
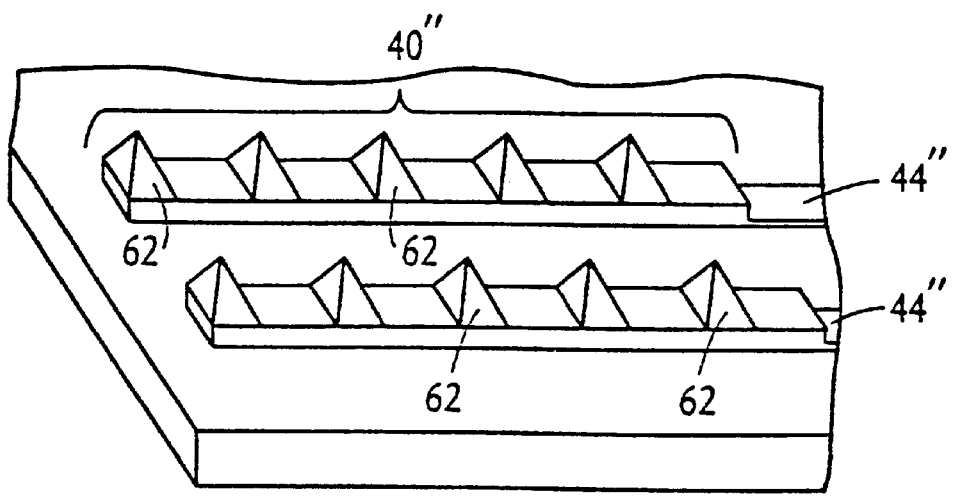
FIG. 7 is a perspective view showing a third embodiment of the present invention.

FIG. 7 is a perspective view showing a third embodiment of the present invention. In the instant embodiment, each of connecting electrodes 40" includes a plurality of separate pyramid-like portions 62 arranged in tandem with the two adjacent portions 62 electrically coupled with each other. Further, as in the first and second embodiments, the connecting terminals 40" are respectively coupled to (or integrated with) corresponding conductive leads 44". From the foregoing, it will be understood how to establish a pressure-contact between each of the terminals 40" and a corresponding terminal of a given circuit board (corresponding to the board 52 of FIG. 5).

Fabricating the connecting terminals 40" of the third embodiment may require a slightly larger number of etching processes compared to the terminals 40' of the second embodiment. However, the third embodiment is such that less pressure is needed to deform the top portions of the connecting terminals 40" compared with each of the first and second embodiments. This is because a sharp tip portion is formed on a top of each pyramid-like connecting terminal 40". Further, when the terminals 40" become pressure-contacted with other terminals (as in the case of FIG. 5), the adhesive (corresponding to the adhesive 54 of FIG. 5) serves to more reliably secure the base film 42 to the circuit board (corresponding to the board 52 of FIG. 5).

As mentioned above, each of the connecting terminals 40, 40' and 40" are in pressure-contact with the counterparts deposited on the board 42. Since the pressure-contact area can be rendered markedly small compared with the prior art, the present invention is well suited for fine-pitch interconnection. It will be understood that the above disclosure is representative of only three possible embodiments of the present invention and that the concept on which the invention is based is not specifically limited thereto.

What is claimed is:

1. A tape carrier package comprising:
a base film of electrically non-conductive material, said base film carrying a plurality of electrically conductive leads on a surface thereof; and
a plurality of electrically conductive connecting terminals deposited on said surface and electrically interconnected to said electrically conductive leads, each of the electrically conductive connecting terminals having an acute-angled top portion, and consisting of an inner member of a first electrically conductive material secured on said surface and an outer member of a second electrically conductive material plated on said inner member, said second electrically conductive material being more easily deformable than said first electrically conductive material whereupon under pressure loading the top portions of the outer members are deformable without deforming the inner members.

2. A tape carrier package as claimed in claim 1, wherein each of said electrically conductive connecting terminals has an essentially prism-like configuration.

3. A tape carrier package as claimed in claim 1, wherein each of said electrically conductive connecting terminals includes a plurality of separate prism-like members arranged in tandem, two adjacent prism-like members being electrically coupled with each other.

4. A tape carrier package as claimed in claim 1, wherein each of said electrically conductive connecting terminals includes a plurality of separate pyramid-like members arranged in tandem, two adjacent pyramid-like members being electrically coupled with each other.

5. A tape carrier package comprising:
a base film made of electrically non-conductive material, said base film carrying a plurality of electrically conductive leads on a surface thereof; and
a plurality of electrically conductive connecting terminals deposited on said surface and electrically interconnected to said electrically conductive leads, each of the electrically conductive connecting terminals being substantially a prism-like member having an acute-angled top portion, each of the electrically conductive connecting terminals consisting of an inner member of a first electrically conductive material secured on said surface and an outer member of a second electrically conductive material plated on said inner member, said second electrically conductive material being more easily deformable than said first electrically conductive material whereupon under pressure loading the top portions of the outer members are deformable without deforming the inner members.

6. A tape carrier package comprising:
a base film made of electrically non-conductive material, said base film carrying a plurality of electrically conductive leads on a surface thereof; and
a plurality of electrically conductive connecting terminals deposited on said surface and electrically interconnected to said electrically conductive leads, each of the electrically conductive connecting terminals including a plurality of separate prism-like members arranged in tandem, two adjacent prism-like members being electrically coupled with each other, each of the electrically conductive connecting terminals having an acute-angled top portion, and consisting of an inner member of a first electrically conductive material secured on said surface and an outer member of a second electrically conductive material plated on said inner member, said second electrically conductive material being more easily deformable than said first electrically conductive material whereupon under pressure loading the top portions of the outer members are deformable without deforming the inner members.

7. A tape carrier package comprising:
a base film made of electrically non-conductive material, said base film carrying a plurality of electrically conductive leads on a surface thereof; and a plurality of electrically conductive connecting terminals deposited on said surface and electrically interconnected to said electrically conductive leads, each of the electrically connecting terminals including a plurality of separate pyramid-like members arranged in tandem, two adjacent pyramid-like members being electrically coupled with each other, each of the connecting terminals having an acute-angled top portion, and consisting of an inner member of a first electrically conductive material secured on said surface and an outer member of a second electrically conductive material plated on said inner member, said second electrically conductive material being more easily deformable than said first electrically conductive material whereupon under pressure loading the top portions of the outer members are deformable without deforming the inner members.

8. A method of interconnecting a tape carrier package to an external circuit board, said tape carrier packaging comprising: a base film of electrically non-conductive material, said base film carrying a plurality of electrically conductive leads on a surface thereof; a plurality of electrically conductive connecting terminals being deposited on said surface and electrically interconnected to said electrically conductive leads, each of the electrically conductive connecting terminals having an acute-angled top portion, each of the electrically conductive connecting terminals consisting of an inner member of a first electrically conductive material secured on said surface and an outer member of a second electrically conductive material covering said inner member, said second electrically conductive material being more easily deformable than said first electrically conductive material, said method comprising the steps of:

coating an adhesive on an area including a plurality of electrically conductive connecting terminals which are deposited on said external circuit board and which are made of an electrically conductive material similar to said first electrically conductive material;

placing said tape carrier package on said external circuit board in a manner where the connecting terminals of said tape carrier package are aligned with corresponding electrically conductive connecting terminals of said external circuit board; and pressing said tape carrier package towards said external circuit board so that said acute-angled top portion contacts a corresponding electrically conductive connecting terminal of said external circuit board and establishes a pressure-contact therewith by deforming the top portions of the outer members.

9. A method as claimed in claim 8, wherein said adhesive comprises an epoxy resin.

* * * * *